United States Patent [19]

Baines et al.

[11] 3,882,691

[45] May 13, 1975

[54] APPARATUS FOR COOLING ELECTRICAL CIRCUIT COMPONENTS

[76] Inventors: Donald Baines; Godfrey Roger Houseman, both of Stockport, England

[22] Filed: June 8, 1972

[21] Appl. No.: 263,346

[30] Foreign Application Priority Data

June 10, 1971 United Kingdom.............. 27363/71

[52] U.S. Cl. ...................... 62/225; 62/217; 62/419; 62/439

[51] Int. Cl. ........................................ F25b 41/04

[58] Field of Search ....... 62/62, 419, 217, 341, 439, 62/225

[56] References Cited

UNITED STATES PATENTS

| | | | |
|---|---|---|---|
| 2,282,385 | 5/1942 | Shawhan | 62/217 |
| 2,455,867 | 12/1948 | Kleist | 62/341 |
| 2,531,210 | 11/1950 | Gilson | 62/341 |
| 2,570,250 | 10/1951 | Kleist | 62/439 |

*Primary Examiner*—Meyer Perlin
*Attorney, Agent, or Firm*—Keith Misegades

[57] ABSTRACT

The operating temperature of electrical components on a support is held at an optimum value by a closely adjacent cooling surface. Convection of heat between the components and the cooling surface is provided by a turbulent air draught passing over the components, without any net rise in temperature of the air draught.

5 Claims, 2 Drawing Figures

PATENTED MAY 1 3 1975 3,882,691

APPARATUS FOR COOLING ELECTRICAL CIRCUIT COMPONENTS

BACKGROUND OF THE INVENTION

1. Field of the Invention

The present invention relates to apparatus for cooling electrical or electronic components.

2. Description of the Prior Art

In data processing systems, and central processing units in particular, a large number of electrical and electronic circuits are employed. With recent developments in semiconductor technology, it has become practicable to provide such components in integrated circuit form. Packages of integrated circuits are, generally referred to as I.C.P.'s and a plurality of I.C.P.'s are mounted on circuit boards to form circuits for carrying out particular functions. Since apparatus utilising I.C.P.'s may require at least 20,000 I.C.P.'s to provide required logic functions, some means must be found to dissipate the heat produced by operation of the apparatus.

One such technique for cooling I.C.P.'s involves the placing of I.C.P.'s in contact with a cooling means such as a coldplate or cooling surface and maintaining the coldplate or surface at a particular predetermined temperature. One problem with such a technique is that a particular I.C.P may produce more heat than a corresponding area of the coldplate or surface can dissipate without exceeding the acceptable operationable temperature of the I.C.P. because of the imperfect nature and localised area of the physical contact between the I.C.P. and the coldplate or surface. Thus it is important to provide a uniform and effective heat transfer between randomly positioned I.C.P.'s and a cooling means. One such method of constantly maintaining an adequate and reliable thermal joint between an I.C.P. and a cooling means is to bond them together. However, it is both difficult to bond an assembly including several I.C.P's by this method and difficult and time consuming to replace any I.C.P. if necessary.

SUMMARY OF THE INVENTION

In accordance with the teachings of this invention there is provided apparatus for cooling electrical circuit components mounted on a support including, (1) heat absorbing means positioned in heat absorbing relationship with the components; (2) means for maintaining the heat absorbing means at a temperature lower than the desired operational temperature of the components; (3) means for producing a turbulent flow of gas within a zone between the components and the heat absorbing means; (4) and means for controlling the heat absorbtion conditions such that the temperature of the gas after having passed through the zone is substantially the same as the temperature of the gas before passing through the zone.

DRAWINGS

Figure 1:
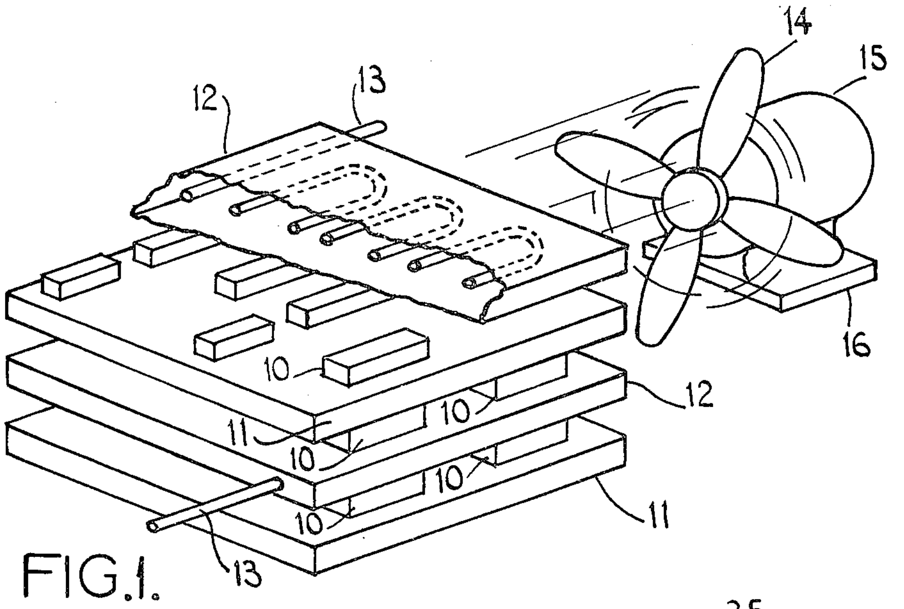
Figure 2:
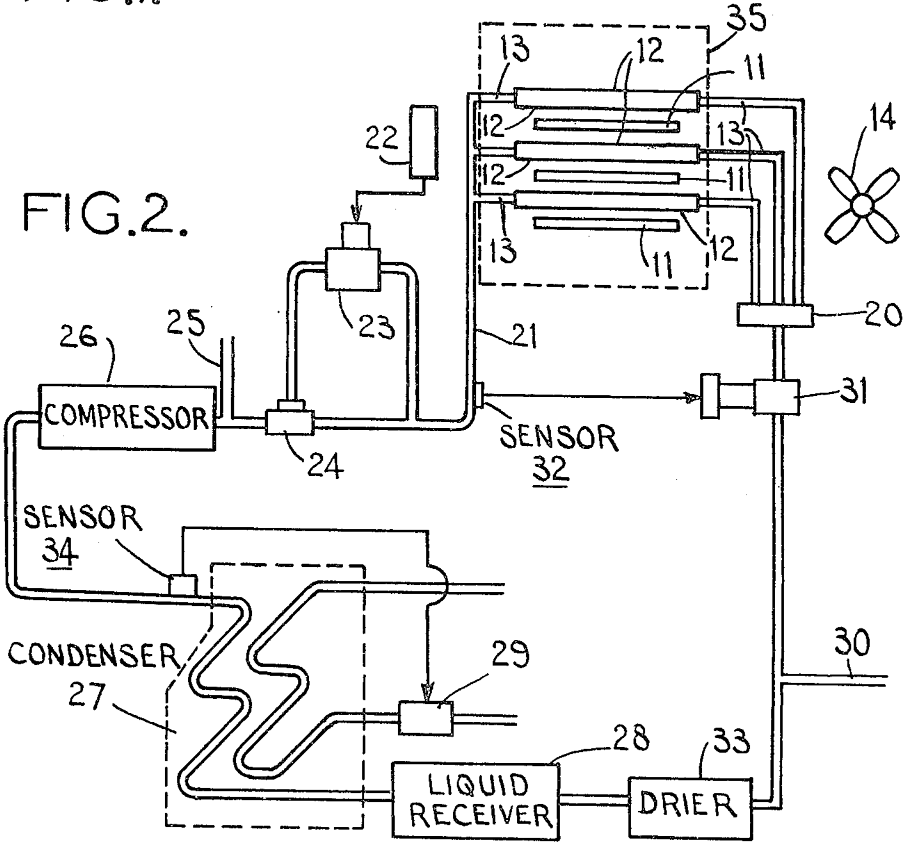

Electrical circuit component cooling apparatus embodying the present invention will now be described, by way of example, with reference to the accompanying drawing, in which:

FIG. 1 shows an isometric view of an apparatus in diagrammatic form for cooling electrical components mounted on circuit boards, and FIG. 2 shows in diagrammatic form a refrigeration system for providing a coolant to a stack of heat absorbing members having cooling surfaces.

DESCRIPTION OF THE INVENTION

Referring now to FIG. 1, there is shown an apparatus in which a plurality of integrated circuit packages 10 are mounted in groups the surface of circuit boards 11. The I.C.P.'s 10 may be mounted (as shown) on one or on both surfaces of a particular circuit board 11. Positioned adjacent to each surface of a circuit board 11 carrying I.C.P.'s 10 is a heat absorbing member 12 having a cooling surfaces spaced from the I.C.P.'s. The circuit boards 11 may be positioned as shown in FIG. 1 and formed into a stack with heat absorbing members 12 positioned such that a cooling surface is spaced from each surface of the circuit boards 11 having I.C.P.'s thereon. Hence if each surface of a number of circuit boards 11 have I.C.P.'s 10 thereon, heat absorbing members 12 are alternated with the circuit boards 11, the end elements of the stack both being members 13.

The heat absorbing members 12 may be formed from material having a good thermal conductivity such as aluminum and are provided with conduits 13 for the delivery and removal of a cooling fluid, such as a known refrigerant fluid which is circulated in a closed refrigeration cycle to be described below. If desired water may be used, either associated with a cooling system in which case the water is recirculated, or the egressing water may flow to waste.

A fan 14 driven by a motor 15 having a conventional speed control mounted on a base plate 16 provides a stream of moving gas which is directed towards the circuit boards 11 to produce a turbulent air flow between each surface of the circuit boards 11 and its associated cooling member 12, the air flow passing over and round the I.C.P.'s 10 of each groups. The fan is arranged to provide any desired volumetric flow per unit time of the gas such as air. If desired an inert gas such as nitrogen may be used in special locations.

As noted previously, one of the problems in cooling circuit components in contact with a cooling surface, is that more heat may be produced per unit area of the cooling surface than can be dissipated by that unit area at a particular I.C.P. operational temperature. However, by providing a low velocity turbulent air flow between the boards 11 and the cooling surfaces of the members 12, heat transfer, by convection, between the I.C.P.'s 10 and the adjacent cooling surface 12 is substantially improved. The velocity of air moved by fan 14 is preset to a level sufficient to obtain an adequate amount of heat transfer between the I.C.P.'s 10 and the cooling surface 12, yet not so fast that the heat carried by the air leaving the space between the board 11 and the cooling surface 12 will be substantial. Also, by improving the heat transfer from I.C.P.'s 10 to the cooling surface 12 in this manner, it has been found that the heat generated by any particular I.C.P. 10 will be dissipated to a greater area of cooling surface than if no air flow were present.

In this way, the area of cooling surface absorbing the heat is effectively larger than the area of the I.C.P producing the heat. Consequently, the cooling surface 12 can absorb more heat without the difference in the surface temperature of the I.C.P. 10 and that of the cooling surface 12 exceeding a predetermined amount.

Thus, in this manner, thermal resistance between the I.C.P.'s 10 and the cooling surface 12 is reduced by the air flow produced by fan 14 while expelled air will not act to increase the ambient temperature of the atmosphere surrounding the apparatus.

In practice, each circuit board 11 may have 200 I.C.P.'s mounted thereon with each I.C.P. dissipating say, 1.5 watt. Thus, each cooling surface 12 must be capable of dissipating 300 watt which for a heat absorbing member of, say, 10 by 16 inches, will result in approximately 2 w/in$^2$ of heat requiring to be dissipated. Also, the boards 11 and the cooling surfaces 12 may be arranged in stacks of, say 120 boards, and may be arranged in any convenient attitude.

Referring now to FIG. 2, there is shown a system for supplying a refrigerant fluid to the conduits 13. The circuit boards 11 carrying I.C.P.'s 10 (FIG. 1) are spaced away from the alternating arrangement of cooling surfaces 12 and conduits 13 to form a zone of heat absorbtion 35. The fan 14, as in FIG. 1, will supply a low velocity air flow over the boards 11 in the zone 35. A refrigerant fluid is supplied through a thermostatic expansion valve 31 to a manifold 20 and to individual conduits 13 to cool corresponding heat absorbing member with the cooling surfaces 12. A return line 21 collects the refrigerant from conduits 13 and passes the refrigerant to a main valve 24 which is controlled by an arrangement comprised of an air temperature sensor 22 and a pilot valve 23. A return line 25 from other stacks of circuit boards and heat absorbing members (not shown) passes all the return refrigerant to a compressor 26. The compressed fluid is condensed in a condensor 27 which is water cooled. A sensor 34 controls a water valve 29 which in turn controls the cooling of the condenser 27. A liquid receiver 28 and a drier 33 are connected to the outlet of the condensor 27 while an outlet 30 passes the cooled refrigerant fluid to other stacks of the boards 11 and the heat absorbing members 12.

In operation, the sensor 32 provides a control signal to a thermostatic expansion valve 31 which in turn controls the flow of refrigerant fluid through the members 12. If the rate of flow is so great that there is a risk of the refrigerant leaving the members 12 in liquid form, the valve 31 is slightly closed to reduce the flow. The air temperature sensor 22 senses the temperature of air in the zone 35 after passing over the I.C.P.'s 10 (FIG. 1) mounted on the boards 11. If the air temperature has increased, an indication of this increase is passed to the pilot valve 23 which, with the main valve 24, controls the evaporation pressure of the refrigerant fluid. In this case, the evaporating pressure is reduced which has the effect of decreasing the temperature of the refrigerant fluid which, in turn, reduces the temperature of the cooling surfaces 12 and the air temperature of air being forced across boards 11 by fan 14. Similarly, increasing the evaporation pressure will increase the temperature of the air flow.

In steady conditions, i.e. when the heat being dissipated by the I.C.P.'s 10 (FIG. 1) is substantially constant, the air temperature detected by the sensor 22 will be substantially the same as that of the air being forced by the fan 14. However, if for example, only some of the I.C.P.'s 10 are dissipating heat at any one time and shortly thereafter, the remaining I.C.P.'s become conductive and dissipate heat, the temperature of the air forced over the boards 11 will increase as the cooling surfaces 12 are not at this stage cold enough to absorb the extra heat dissipated. This increase in air temperature is sensed by the sensor 22 which enables the temperature of the cooling surfaces 12 to be controlled to a predetermined level, say 20° C. Thus, in a transient case, there will be temporary increases in air temperature and cooling surface temperature while in a steady state condition, there will be approximately constant air and cooling surface temperatures. Of course, if one cooling system as shown in FIG. 2 is employed to cool say 3 – 4,000 or so I.C.P.'s 10, there will be a substantially constant or average level of heat dissipation level and, for the most part, the system will operate in steady state conditions to keep the surface temperature of all I.C.P.'s at a predetermined level.

While integrated circuit packages have been disclosed as circuit components which dissipate heat, it will be realised that other types of integrated circuits, and electrical or electronic components could be cooled as well by the system described above.

For a particular unit the cooling surfaces 12 and boards 11 may be arranged in three stacks, each stack having 120 sets of boards 11 and heat absorbing members 12 and forming one zone 35. Also, while only a single thermostatic valve 31 has been disclosed with respect to a stack (FIG. 2), it will be realised that more than one such valve 31 may be necessary for each stack.

When more than one thermostatic valve 31 is used in relation to a stack, the heat absorbing members are divided into zones 35, each zone 35 being under the control of its own valve 31 and sensor 32 combination. Thus a stack may, if desired, be divided into lower, centre and upper zones, each zone being separately controlled by an associated valve 31/sensor 32 combination.

It will be seen from FIGS. 1 and 2 that the electrical components may be arranged on one surface of a support or on two opposed surfaces of the same support. It will also be seen that a stack of supports and cooling members may be made. In the drawing which shows the essential integers of a stack, the top and bottom of a stack may be seen together with a central portion which portion would be expanded or duplicated many times in practice in order to produce the stacks previously referred to of, say, 120 boards.

At the top of a stack a double surfaces circuit board is shown and hence the uppermost element of the stack is a heat absorbing member, in order that the components on the upper surface of this circuit board are adequately cooled.

For illustrative purposes only the circuit board shown at the bottom of the stack has components mounted only on the inner support surface and hence it is not essential to provide a heat absorbing member adjacent the unused support surface, although, either a heat absorbing member could be provided if desired or, a double surfaced circuit board similar to that illustrated at the top of the stack could be used in which case a heat absorbing member would be provided and the bottom of the stack would resemble the top as illustrated.

Further it will be seen that the two upper circuit boards of FIG. 2 each have components mounted on two opposed support surfaces and are arranged to have a cooling surface of a heat absorbing member positioned adjacent to each support surface. It will be appreciated that this arrangement may be repeated or duplicated in order to produce a central portion of a stack, having the required number of circuit boards positioned between a top and a bottom section as described above.

While the heat absorbing members 12 have been described as being formed of aluminum, any other suitable material such as copper or magnesium may be employed, further the conduits 13 may be formed integrally with the members by such processes as extruding, roll bonding or casting.

The velocity at which the fan 14 forces air over the boards 11 may be preset to obtain the most efficient transfer of heat from I.C.P.'s 10 to coldplates 12. If, for example, air is moved over the boards 11 too quickly, heat produced by I.C.P.'s 10 will be carried away and not absorbed by the cooling surfaces 12. As a result of this the temperature of the forced air will rise. If the air is not moved quickly enough, concentrations of heat from I.C.P.'s 10 may exceed the capacity of portions of the members 12 with the cooling surfaces thereof exceeding a predetermined maximum temperature. It has been found that such an optimum velocity may be 5.0 ft/sec. but will depend on the particular configuration of the circuit boards 11, heat absorbing means, etc.

Also, it will be appreciated that a suitable liquid coolant, rather than a fluid refrigerant may be employed. The cooling surfaces 12 may be provided with a plurality of fins to increase the surface area, and therefore heat transfer.

We claim:

1. An electrical circuit arrangement comprising: a support member; a plurality of electrical components mounted on a support surface of said support member; a cooling member positioned adjacent to and spaced from said components, said cooling member having a cooling surface which faces said support surface; means for maintaining said cooling member at a temperature lower than a desired operational temperature of the components; means for producing a turbulent flow of gas between said surfaces thereby promoting convective transfer of heat from said components to said cooling surface; and means for controlling the rate of absorbtion of heat by said cooling means such that the temperature of the gas after passing between said surfaces is substantially the same as the temperature of the gas before passing between said surfaces.

2. An arrangement as claimed in claim 1 wherein said cooling member has a further cooling surface disposed on the opposite side of the cooling member to the first-mentioned cooling surface, the arrangement further including: a further support member positioned adjacent to and spaced from said cooling member, said further support member having a further support surface which faces said further cooling surface; and a further plurality of electrical components mounted on said further support surface, said turbulent flow of gas passing also between said further support surface and said further cooling surface thereby promoting convective transfer of heat from said further components to said further cooling surface.

3. An arrangement according to claim 1 wherein said support member has a further support surface disposed on the opposite side of the support member to the first-mentioned support surface, the arrangement further including: a further cooling member positioned adjacent to and spaced from said support member, said further cooling member having a further cooling surface which faces said further support surface; and a further plurality of electrical components mounted on said further support surface, said turbulent flow of gas passing also between said further support surface and said further cooling surface thereby providing convective transfer of heat from said further components to said further cooling surface.

4. An arrangement according to claim 1 wherein said means for controlling the rate of absorbtion of heat by said cooling means comprises: means for monitoring the temperature of said gas after passing between said surfaces; and means responsive to said monitoring means, for controlling said rate of absorbtion, to substantially compensate for fluctuations in the rate of heat dissipation by said components.

5. An electrical circuit arrangement comprising:

a plurality of support members each having at least one support surface; a plurality of electrical components mounted on each said support surface; a plurality of cooling members arranged alternatively with said support members in a stack, each said cooling member having at least one cooling surface which faces and is spaced from a corresponding one of said support surfaces; means for maintaining said cooling members at a temperature lower than a desired operational temperature of the components; means for producing a turbulent flow of gas between each said support surface and its corresponding facing cooling surface thereby promoting convective transfer of heat from said components to said cooling members, and means for controlling the rate of absorbtion of heat by said cooling members such that the temperature of the gas after passing between said surfaces is substantially the same as the temperature of the gas before passing between said surfaces.

* * * * *